(12) United States Patent
Murphy et al.

(10) Patent No.: US 8,618,859 B1
(45) Date of Patent: Dec. 31, 2013

(54) GENERATING HIGH-FREQUENCY, NON-OVERLAPPING CLOCKS

(71) Applicant: Broadcom Corporation, Irvine, CA (US)

(72) Inventors: David Murphy, Costa Mesa, CA (US); Hooman Darabi, Laguna Niguel, CA (US); Hao Xu, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/666,881

(22) Filed: Nov. 1, 2012

(51) Int. Cl.
*H03K 3/00* (2006.01)
(52) U.S. Cl.
USPC ............................ 327/291; 327/256; 327/296
(58) Field of Classification Search
USPC .......... 327/256–259, 291, 295, 296, 113–116
See application file for complete search history.

(56) References Cited

U.S. PATENT DOCUMENTS 7,075,352 B2 * 7/2006 Kim et al. ...................... 327/291

OTHER PUBLICATIONS

Murphy, "Noise in Large-Signal, Time Varying RF CMOS Circuits: Theory & Design," 2012 Dissertation, UCLA.
Murphy, et al., "A Blocker-Tolerant Wideband Noise-Canceling Receiver with a 2db Noise Figure," 2012 IEEE International Solid State Circuits Conference.
Murphy, et al., "A Blocker-Tolerant, Noise-Canceling Receiver Suitable for Wideband Wireless Applications," IEEE J of Solid State Circuits, Dec. 2012, vol. 47, No. 12.

* cited by examiner

*Primary Examiner* — An Luu
(74) *Attorney, Agent, or Firm* — McDermott Will & Emery LLP

(57) ABSTRACT

A method for generation of high frequency, non-overlapping clocks may include receiving input clock signals at a clock input node of a circuit. Multiple feedback signals may be received at a number of input feedback nodes of the circuit. At a startup node, a startup signal of the circuit may be received, and, in response to receiving the startup signal, an output clock may be generated at a predefined portion of at least one of the received input clock signals. A stable high frequency output clock may be generated at an output stage by utilizing the feedback signals received by the input feedback nodes.

21 Claims, 7 Drawing Sheets

GENERATING HIGH-FREQUENCY, NON-OVERLAPPING CLOCKS

TECHNICAL FIELD

The present description relates generally to radio frequency (RF) communications, and more particularly, but not exclusively, to generating high frequency, non-overlapping clock signals.

BACKGROUND

Down conversion mixers used in many radio frequency (RF) communication devices may be passive or active. Active mixers may provide conversion gains typically more than zero dB, while passive mixers may provide conversion gains less than zero dB. Passive mixers, however, may have a number of advantages over active mixers. For example, passive mixers may consume less power, have lower noise figure, and cause less distortion, as compared to the active mixers. The lower noise figure in passive mixers is due to nonexistence of flicker noise, which is the main cause of the higher noise figure in active mixers.

Many down conversion mixers used in wireless communication systems include passive mixers, including multiphase mixers, which may be utilized in, for example, over-sampling passive mixers, where multiple local oscillator (LO) signals with the same frequency but phase shifted with respect to each other (e.g., non-overlapping clocks) may be used in conjunction with an appropriate switching network. Multiphase, non-overlapping clock signals may be required for a variety of passive-mixer-based circuits. Current non-overlapping clock generation schemes may suffer from a number of limitations, including low frequency of operation, uncertain startup behavior, difficulty in mode selection, and flicker noise coupling (e.g., when used to drive single-ended passive mixers). Therefore, the need exists for a non-overlapping clock generation technique that can significantly mitigate these problems.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

Figure 1:
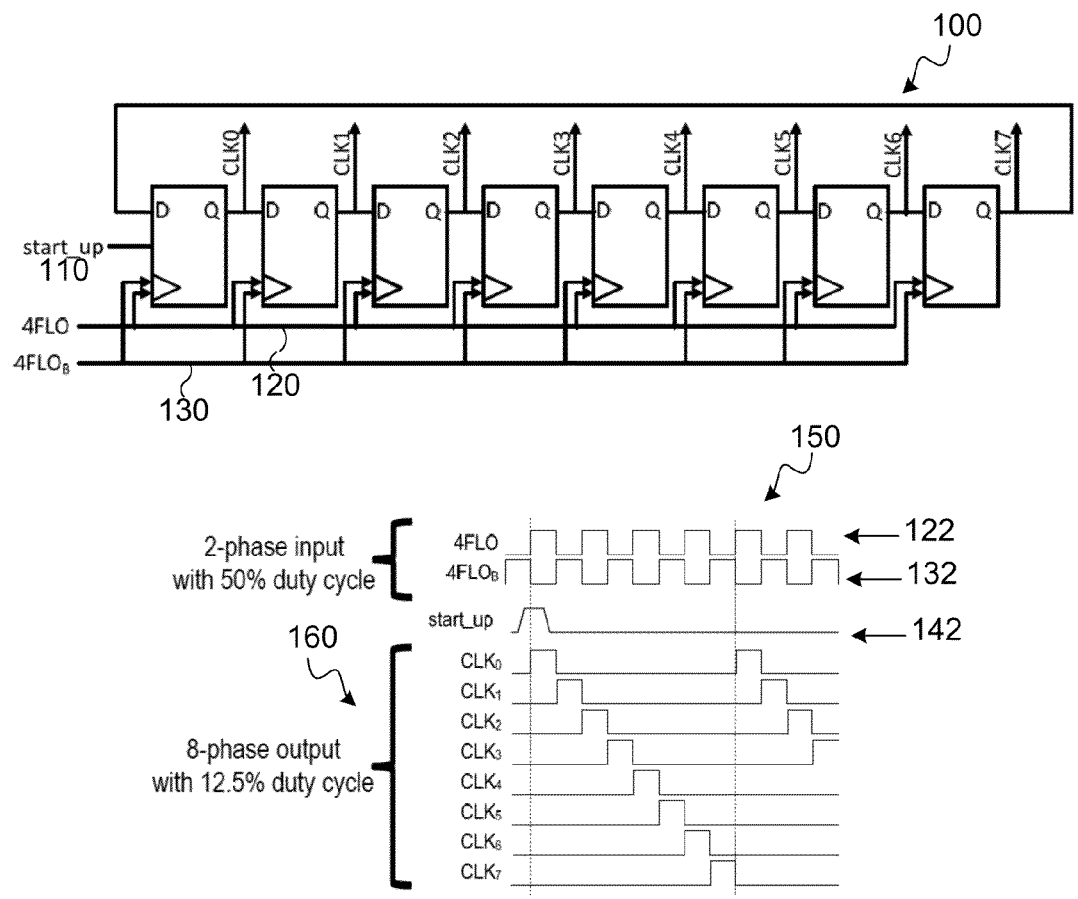
FIG. 1 illustrates a conventional Johnson divider used to generate multiphase clock signals.

FIG. 1 illustrates a conventional Johnson divider 100 used to generate multiphase clock signals 160. The Johnson divider 160 is formed by consecutively connecting eight D-type flip-flop registers. Two input clock pulses 122 and 123 at four times the intended frequency of the output clocks (e.g., FLO) are applied to a clock input of each register. The input clock pulse 132 is an inverted version of the input clock pulse 122, and the input clock pulses 122 and 132 may form a differential pair. The output clocks 160 (e.g., 8-phase output clocks CLK0-CLK7) may be taken from the clock output nodes (i.e., Q) of the individual registers. A start-up signal 142 applied to the start-up node 110, may start the operation of the divider by turning only the first output clock, CLK0 to a logic "high" state (e.g. "HIGH"), at the rising edge of the input clock pulse 122, where the rest of the output clocks (i.e., CLK1-CLK7) are at a logic "low" state (e.g., "LOW"). At the falling edge of the input clock pulse 122, which occurs at the rising edge of the input clock pulse 123, the next clock output (i.e., CLK1) turns to HIGH and the LOW output clock CLK7, turns the CLK0 output to LOW, which stays low for seven more half-cycles of the input clock pulse 122, when the HIGH states successively ripples through clock output nodes (i.e., turns CLk1-CLK7 to HIGH). While Johnson divider 100 works fine for its intended purposes, it may suffer from a number of limitations, such as low frequency operation, uncertain start-up, and difficulty in mode selection.

One of the problems with this configuration is that if multiple registers are pulled HIGH or one register is held HIGH for too long, the divider may operate incorrectly. For example, an extended start-up signal extended beyond a half cycle of the input clock pulses, or misaligned with the input clock pulses, may cause an erroneous operation of the Johnson divider 100, because the output clocks 160 overlap on one-another and cannot be considered non-overlapping clocks. Therefore, a very sharp startup signal (e.g., a startup signal that remains HIGH for less than a single-cycle of the input clock pulse 122) may be required for a stable operation of the Johnson divider 100, which may be difficult to achieve in high frequency operation applications. A further drawback of the Johnson divider 100 is that an external glitch may cause an unwanted HIGH signal to couple onto any of the register outputs, which may not be rejected, and may also lead this divider into an incorrect operation, especially at high frequency operations.

Figure 2:
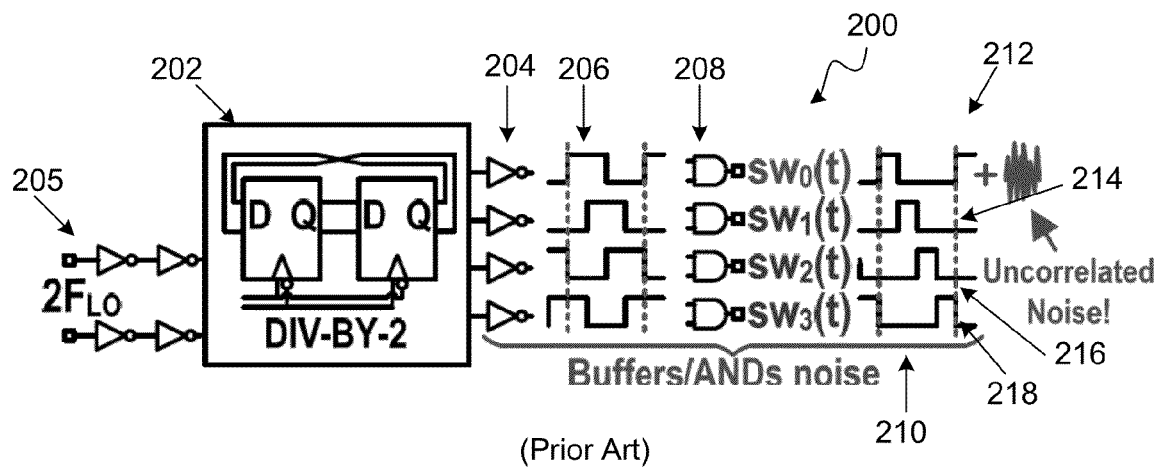
FIG. 2 illustrates a conventional divide-by-two clock generator used to generate multiphase clock signals.

FIG. 2 illustrates a conventional divide-by-two clock generator 200 used to generate multiphase clock signals 210. The divide-by-two clock generator 200A includes a divide-by-two circuit 202 coupled to buffers 204, which may generate overlapping clock signals 206. The clock signals 206 may be converted to 4-phase non-overlapping clock signals 210, by proper logic processing (e.g., logic ANDing) performed by logic circuits 208 (e.g., NAND gates). While the divide-by-two clock generator 200 may have less issues with respect to a noise injected through input clocks 205, which appears at all four clock outputs as correlated noise, than any noise coupled through the buffers 204 or logic circuits 208, which may be an uncorrelated noise that can cause a serious problem. For example, as the clock signals generated by the divide-by-two circuit 202 may be used as 4-phase local oscillator signals of a passive mixer, the uncorrelated noise (e.g., flicker noise) generated by the buffers 204 or the logic circuits 208 of FIG. 2A may couple (e.g., in case of single-ended passive mixers) to an RF path of the respective passive mixer, and show up as additional noise. For instance, the additional noise may include flicker or thermal noise, which may be uncorrelated between differential LO outputs (e.g., LO outputs shown as 212 and 216, or 214 and 218), and may cause the noise figure at near zero frequencies (e.g., DC) to be unacceptably high. Further, the logic circuits 208 may consume significant power, especially at high frequencies, thus rendering the divide-by-two clock generator 200 a power hungry option.

Figure 3A:
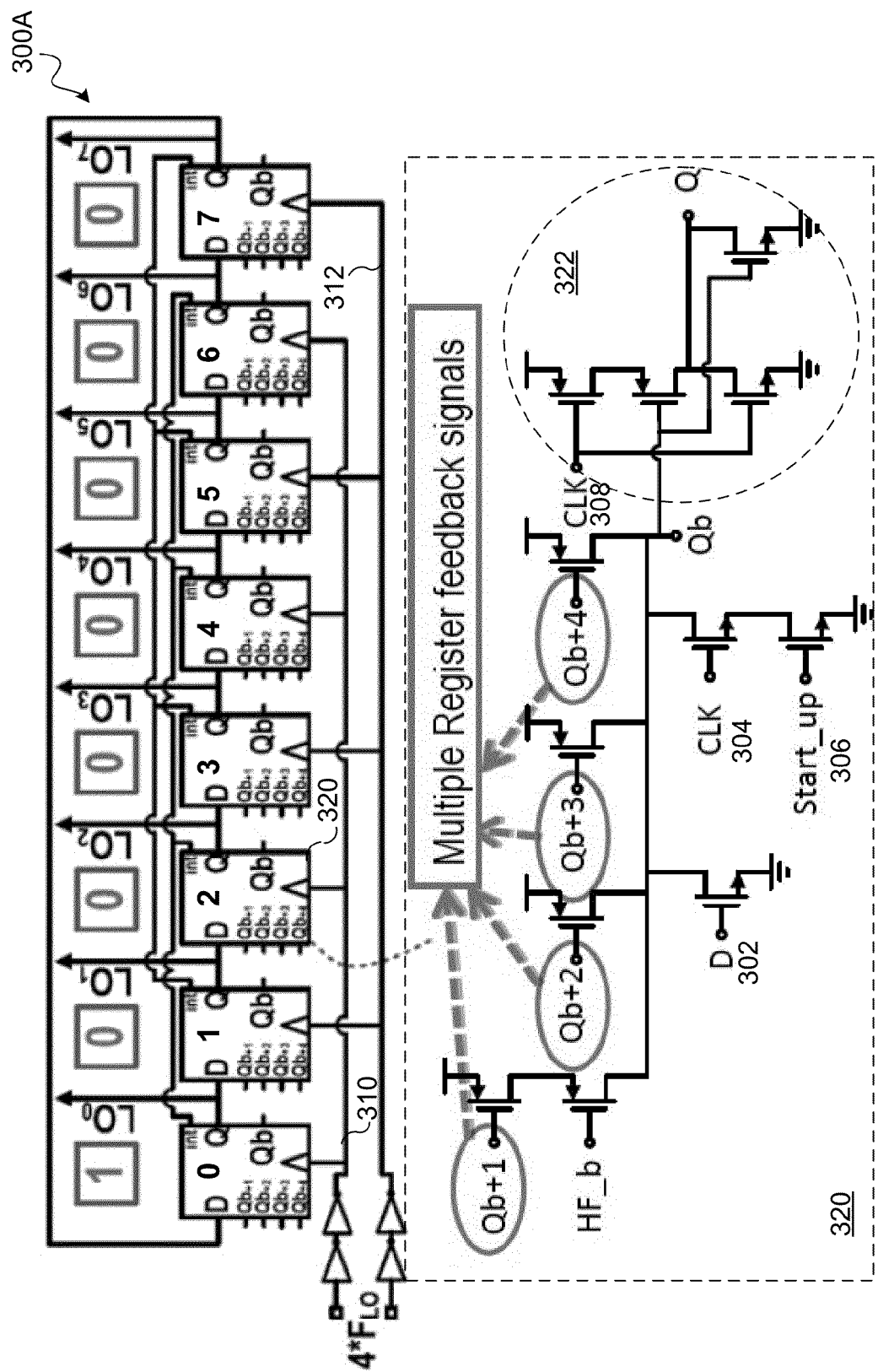
FIG. 3A illustrates an example high frequency non-overlapping clock generator in accordance with one or more implementations.

FIG. 3A illustrates an example high frequency non-overlapping clock generator 300A in accordance with one or more implementations of the present invention. The non-overlapping clock generator (hereinafter "clock generator") 300A includes a number of (e.g., eight) register cells 320 consecutively coupled together (e.g., an output node Q of each register cell is connected to a D-input of the next register cell). The clock generator 300A is a high frequency clock generator that significantly mitigates the limitations of the existing non-overlapping clock generators. For example, the clock generator 300A can operate at high frequencies (e.g., above 3.5 GHz), and yet provide a larger number of non-overlapping clocks (e.g., M-phase output clocks, where M is an even integer, such as 16) with substantially higher output stability and significantly less uncorrelated noise, as compared to the existing solutions.

The input clock signals may be applied to clock lines 310 and 312. The clock line 310 and 312 may be connected, respectively, to input clock nodes of even-numbered and odd-numbered register cells (e.g., the clock line 310 may be connoted to register cells 0, 2, 4 and 8, and the clock line 312 may be connoted to register cells 1, 3, 5 and 7). The input clock signals applied to the clock line 312 may be an inverted version of the input clock signals applied to the clock line 310 (e.g., the applied clock signals may be a differential pair) and both clock lines may run at multiples (e.g., M/2 times for an M-register cell clock generator) of the intended frequency of the generated non-overlapping clock (e.g., $f_c$). For example, for the clock generator 300A with 8 register cells, the input clock signals may run at 4 times the intended frequency $f_c$ of the generated non-overlapping clock.

An important feature of the clock generator 300A lies in the particular design of the register cells 320, which may warrant a stable high frequency operation for the clock generator 300A by providing a unique non-zero stable condition. Each register cell 320 (e.g., one of register cells 0-7) may comprise a clock input node 308 to receive an input clock signal, a D-input node 302 to receive input data, and may provide the input data at an output node Q, at a predefined portion of the received input clock signal (e.g., at a rising edge of the clock signal). The register cell 320 may also include a number of feedback nodes (e.g., $Q_{b+1}$, $Q_{b+2}$, $Q_{b+3}$, and $Q_{b+4}$) to receive multiple feedback signals from successive registers of the clock generator 300A. For example, feedback nodes $Q_{b+1}$, $Q_{b+2}$, $Q_{b+3}$, and $Q_{B+4}$, of the register cell 0, may be coupled to $Q_b$ nodes of register cells 1, 2, 3, and 4, respectively. The register cell 320 may also include a startup node 306 to receive a startup signal. In response to receiving the startup signal, the register cell 320 may generate an output clock (e.g., $LO_0$) at the predefined portion of the received input clock signal (e.g., a rising edge). An output stage 322 of the register cell 320 may be configured to provide the output clock, at the output node Q. The clock input node 308 may be directly coupled to the output stage 322 to reduce uncorrelated noise. The feedback signals received by the feedback nodes $Q_{b+1}$, $Q_{b+2}$, $Q_{b+3}$, and $Q_{B+4}$ may be utilized to provide a stable high frequency output clock by the output stage 322, so that the nonzero portions of the generated clocks would not change by a variation in the speed of the start-up clock or by glitches due to external interferences, as discussed above with respect to the current solutions (see FIG. 1B and FIG. 1C), and only one register cell of the clock generator 300A can be at a HIGH state at any given time.

Figure 3B:
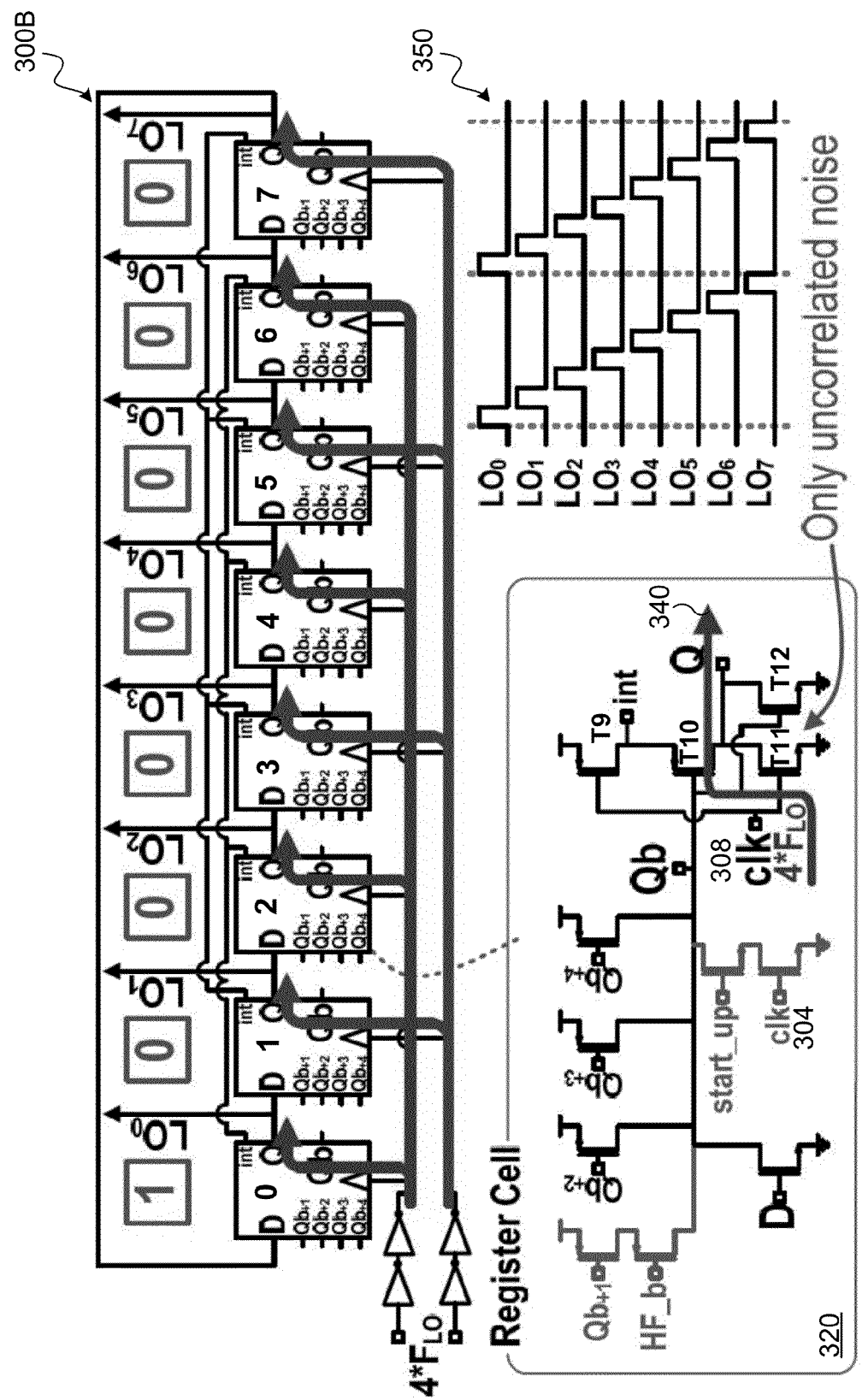
FIG. 3B illustrates an example high frequency non-overlapping clock generator along with an example register cell in accordance with one or more implementations.

FIG. 3B illustrates an example high frequency non-overlapping clock generator 300B along with the register cell 320 in accordance with one or more implementations. The clock generator 300B is similar to the clock generator 300A, except that the input clock signals are shown (e.g., via thick line arrows) to directly go to the output nodes Q of the respective register cells. This is further illustrated in the register cell 320, where the arrow 340 is shown to emphasize the fact that the input clock signals are applied to input clock node 308, which is directly connected to the output stage (e.g., formed by transistors T9, T10, T11, and T12). The advantage of this direct coupling lies in the fact that transistors T10, T11, and T12, may be the only transistors of the register cell 320 that may contribute to generation of the uncorrelated noise (e.g., flicker or thermal noise, which is uncorrelated between differential LO outputs e.g. $LO_0$ and $LO_4$ or $LO_1$ and $LO_5$). Consequently, the register cell 320 may generate high frequency clock signals with considerably less uncorrelated noise. Furthermore, because input 308 may couple directly to the output Q, only transistors T9, T10, T11 and T12 contribute noise (uncorrelated or otherwise). Other transistors of the register cell 320 may not affect the noise performance of the register cell 320.

In one or more implementations, the multiphase (e.g., 8-phase) non-overlapping clocks 350 may enjoy unique non-zero stable conditions, where only one register cell of the clock generator 300A can be at a HIGH state at any given time. This may be warranted by the feedback signals from successive register cells connected to the feedback inputs ($Q_{b+1}$, $Q_{b+2}$, $Q_{b+3}$, and $Q_{B+4}$) of register cell 320. In the register cell 320, the output node Q can be at a LOW state, when either of the output transistors T11 or T12 are conducting, which, in turn, may require either the clock node 308 or the $Q_b$ node to be at a HIGH state. For example, consider the first register cell (register cell 0), the output $LO_0$ of this register cell may be required to be HIGH in only one-eighth (e.g., the first one-eighth) cycle (herein after "T/8") of the output clock signal, and to be LOW in the next seven T/8 of the output clock signal. The output $LO_0$ of register cell 0 may turn to HIGH by the first positive edge of an associated clock signal (also applied to input clock node 304), when the start up signal is HIGH, and have a guaranteed LOW at the third, fifth, and 7th T/8 of the associated clock signal. At the second and fourth T/8 of the associated clock signal, the feedback signals connected to $Q_{b+2}$ and $Q_{b+4}$ feedback inputs from the register cells 2 and 4, respectively, can pull up the $Q_b$ node and therefore, keep the output node Q at a LOW level.

Figure 3C:
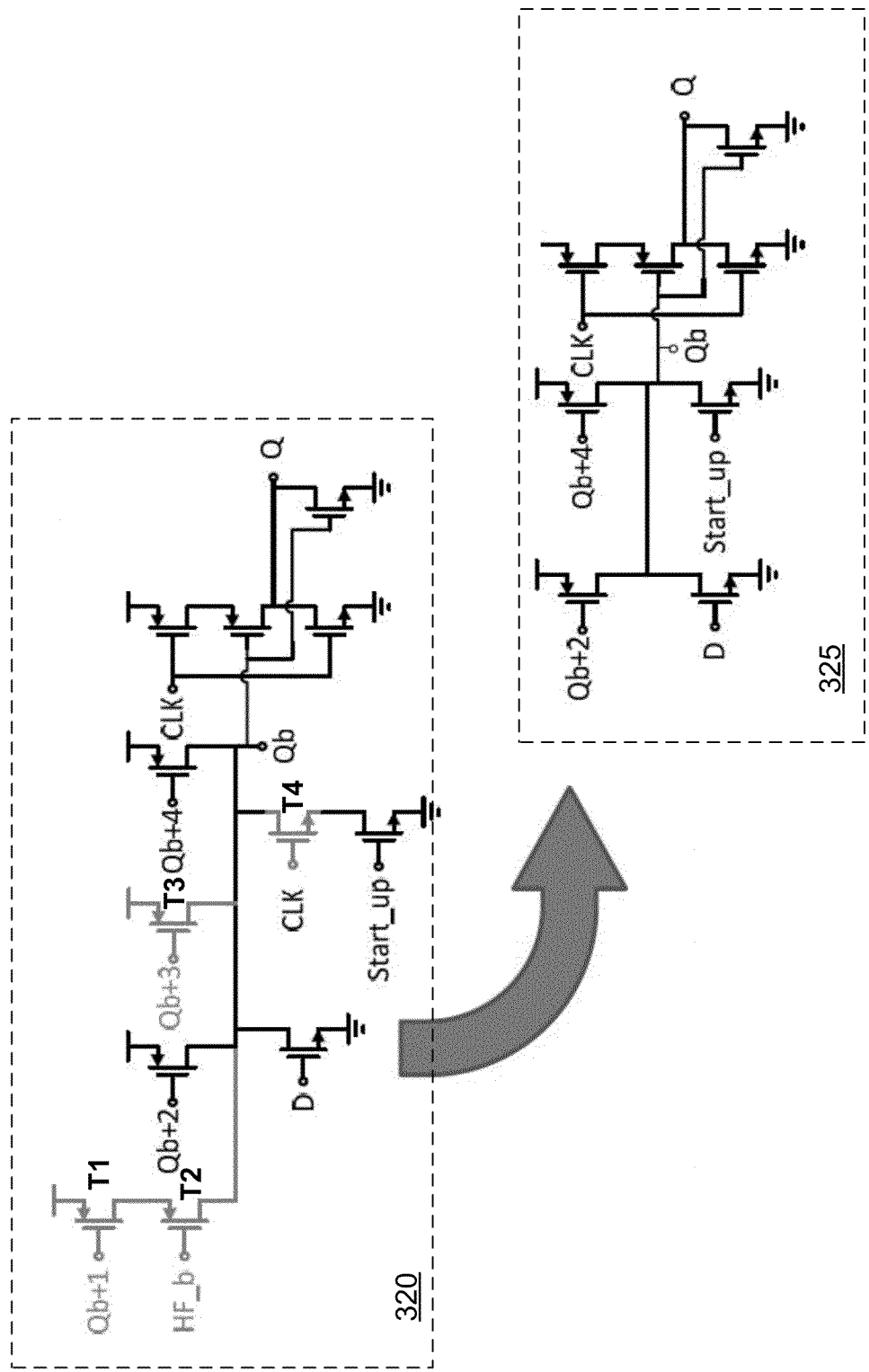
FIG. 3C illustrates example register cells for the non-overlapping clock generator of FIG. 3B in accordance with one or more implementations.

FIG. 3C illustrates example register cells for the high frequency non-overlapping clock generator 300B of FIG. 3B in accordance with one or more implementations. As discussed above, with respect to FIG. 3B, the feedback configuration of the register cell 320 allows for the output clock signal at output node Q to stay at LOW for seven T/8 of the cycle of the output clock signal and stay at HIGH in only one T/8 of the cycle, which is a desirable feature of the register cell 320. However, as shown above, for the register cell 320 to sustain this desirable feature, only feedback signals connected to $Q_{b+2}$ and $Q_{b+4}$ may be sufficient for proper operation of the register cell 320. Accordingly, in one or more implementations, the register cell 320 may be simplified by omitting four transistors T1, T2, T3, and T4 to reduce the register cell 320 to a simplified register cell 325, which for most circumstances can perform satisfactorily. Although the optional transistors T1, T2, T3, and T4 may, to some extent, improve the performance of the register cell 320 as compared to register cell 325.

Figure 4A:
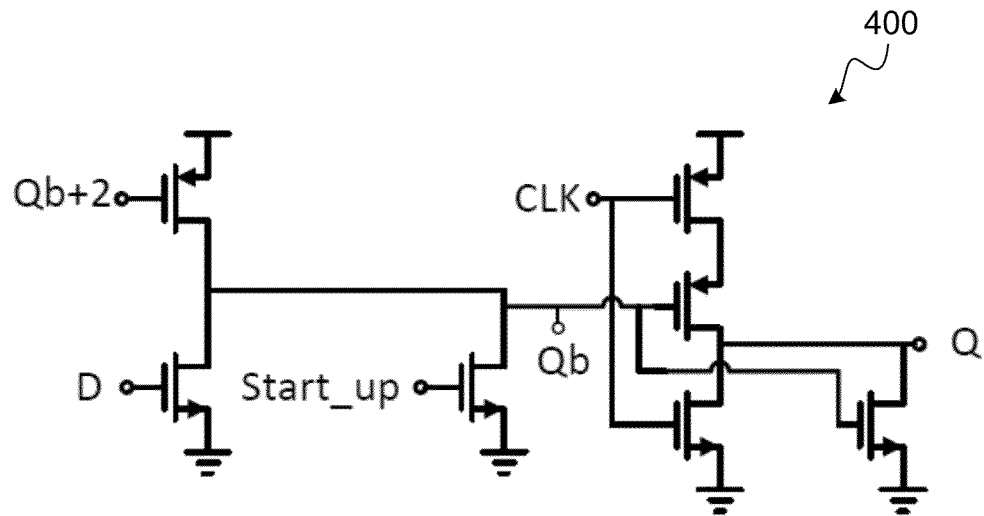
FIG. 4A illustrates an example register cell of a 4-register non-overlapping clock generator in accordance with one or more implementations.

FIG. 4A illustrates an example register cell 400 of a 4-register clock generator in accordance with one or more implementations of the present invention. The register cell 400 can be used in a 4-register clock generator (e.g. M=4), which may be substantially similar to the 8-register clock generator 300B of FIG. 3B. The register cell 400 is a simplified version and has only one input clock node and one feedback node (e.g., $Q_{b+2}$). It is understood that in general, for a M-register clock generator, according to the subject technology, only M/4 feedback signal (e.g., one for the 4-register clock generator) may be sufficient to provide for M non-overlapping clocks (e.g., M-phase) with a unique non-zero stable condition at high frequencies, when appropriate input clock (e.g., differential input signals running at M/2 times the output clock frequency) are applied.

Figure 4B:
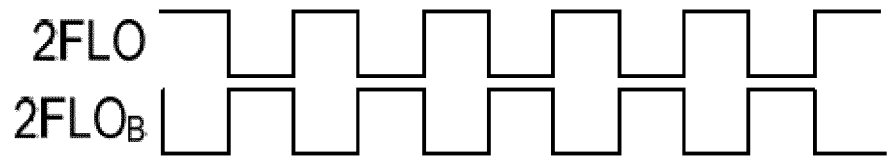
FIG. 4B illustrates example clock signals of a 4-register non-overlapping clock generator using the register cell of FIG. 4A in accordance with one or more implementations.
Figure 4B:
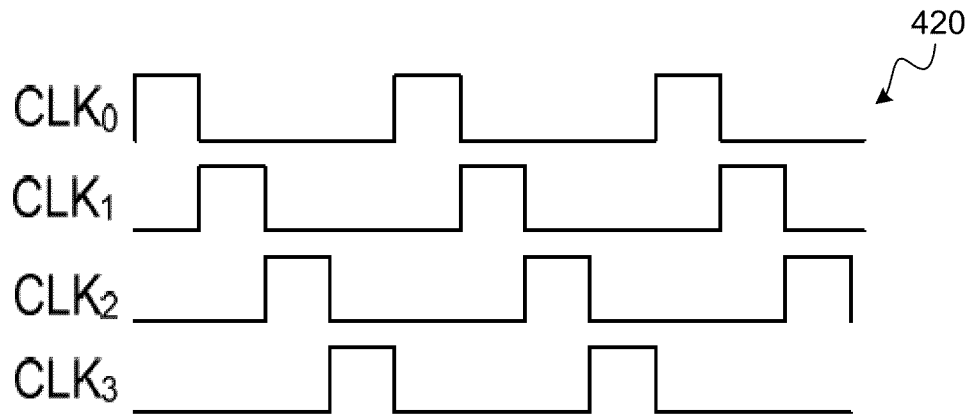

FIG. 4B illustrates example clock signals of a 4-register clock generator using the register cell 400 of FIG. 4A in accordance with one or more implementations of the present invention. The differential clocks 410, as shown, are running at 2 (i.e., M/2) time the frequency of output clock signals 420, which include a 4-phase (e.g., M-phase) output clock with a unique non-zero stable condition at high frequencies.

Figure 5A:
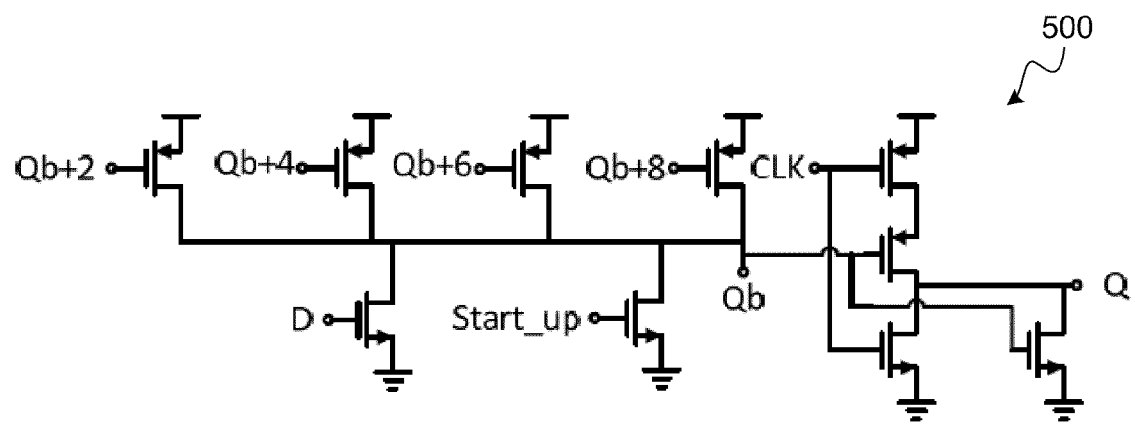
FIG. 5A illustrates an example register cell of a 16-register non-overlapping clock generator in accordance with one or more implementations.

FIG. 5A illustrates an example register cell 500 of a 16-register clock generator in accordance with one or more implementations of the present invention. The register cell 500 may be used in a 16-register clock generator (e.g. M=16), which can be substantially similar to the 8-register clock generator 300B of FIG. 3B. The register cell 500 is a simplified version and has only four (e.g. M/4) input feedback nodes (e.g., $Q_{b+2}$, $Q_{b+4}$, $Q_{b+6}$, and $Q_{B+8}$) and one input clock node. The other nodes (e.g., D, CLK, start-up, and $Q_b$) are the same as the 8-register clock generator 300B.

Figure 5B:
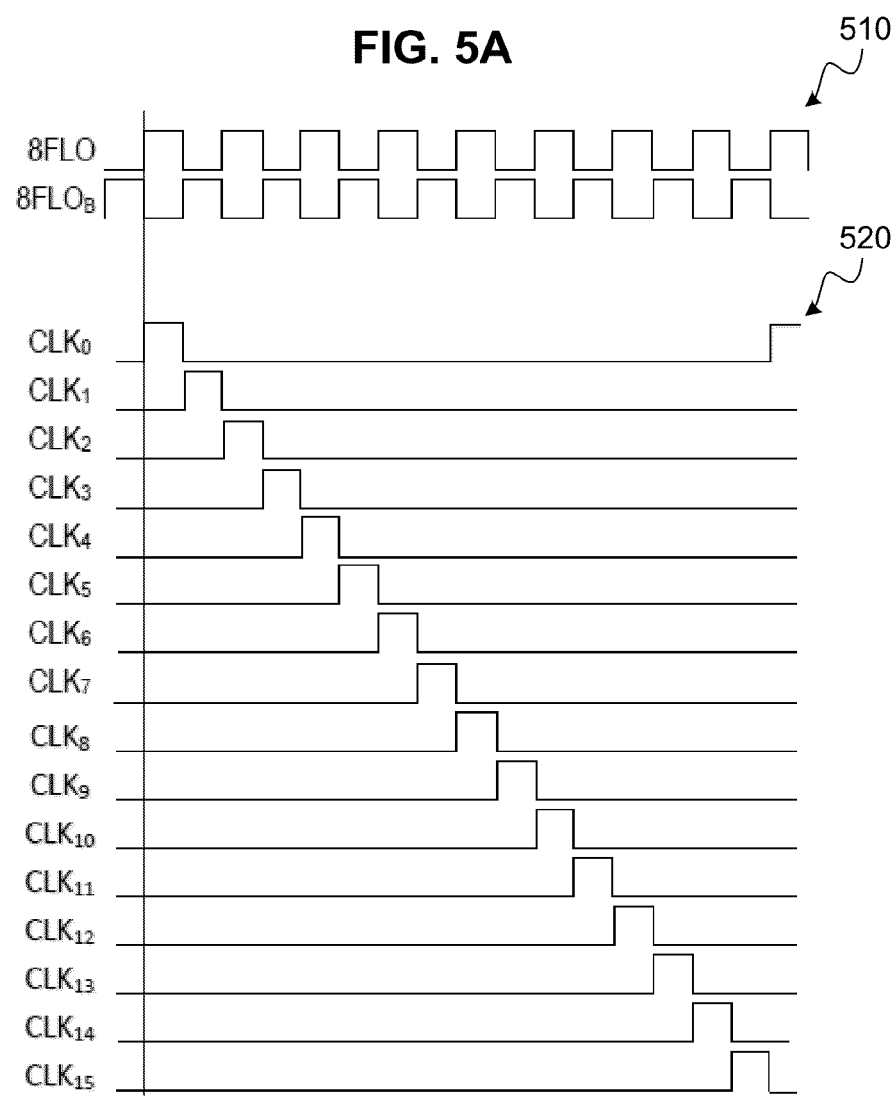
FIG. 5B illustrates example clock signals of a 16-register non-overlapping clock generator using the register cell of FIG. 5A in accordance with one or more implementations.

FIG. 5B illustrates example clock signals 510 of a 16-register clock generator using the register cell 500 of FIG. 5A in accordance with one or more implementations of the present invention. The differential clocks 510, as shown, are running at 8 (i.e., M/2) time the frequency of output clock signals 520, which include a 16-phase (e.g., M-phase) output clock with unique non-zero stable condition at high frequencies.

Figure 6:
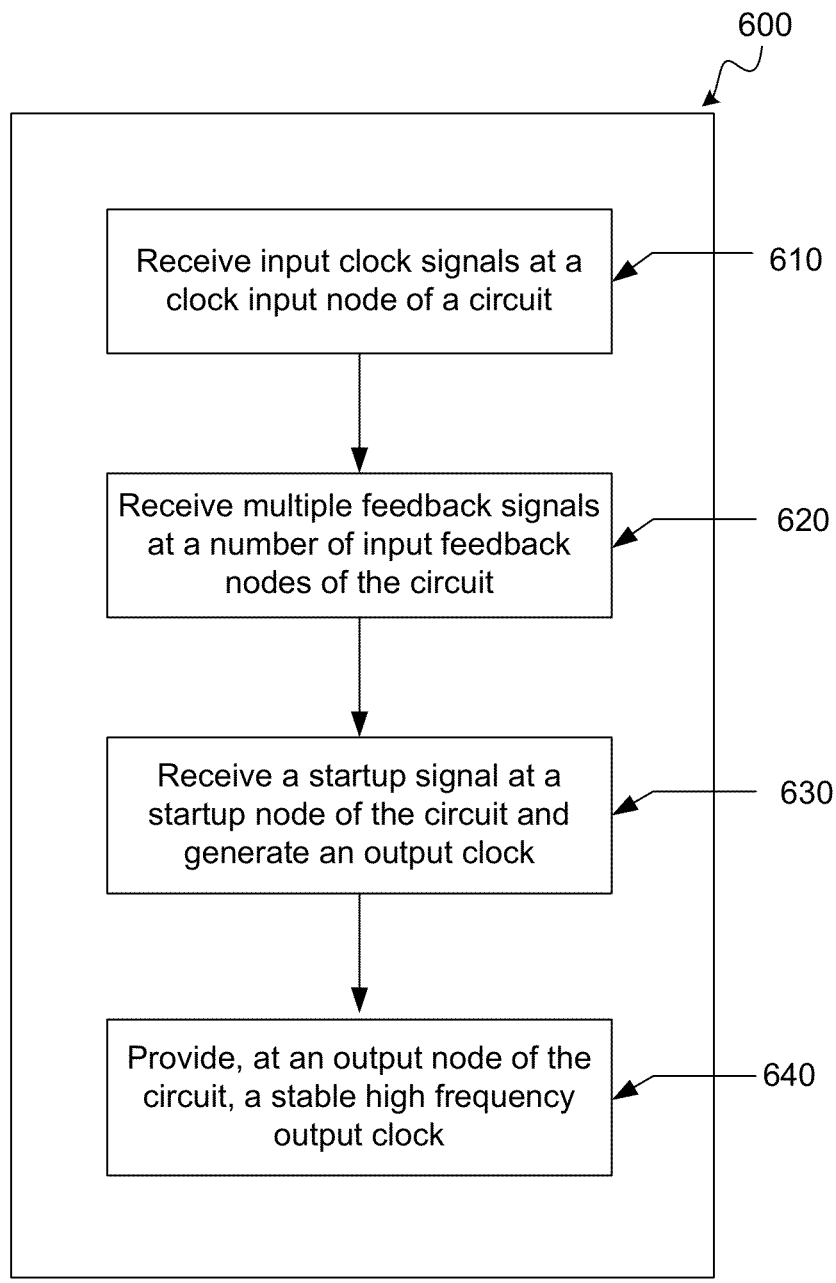
FIG. 6 illustrates an example method for generating high frequency non-overlapping clock signals in accordance with one or more implementations.

FIG. 6 illustrates an example method 600 for generating high frequency non-overlapping clock signals in accordance with one or more implementations of the present invention. For explanatory purposes, the example method 600 is described herein with reference to the clock generator 300A of FIG. 3A and clock signals 350 of FIG. 3B and clock signals 410 and 420 of FIG. 4B; however, the example method 600 is not limited to the clock generator 300A and clock signals 350, 410 and 420. Further for explanatory purposes, the blocks of the example method 600 are described herein as occurring in serial, or linearly. However, multiple blocks of the example method 600 may occur in parallel. In addition, the blocks of the example method 600 need not be performed in the order shown and/or one or more of the blocks of the example method 600 need not be performed.

At operation block 610, input clock signals (e.g., 410) may be received at a clock input node 308 of FIG. 3A of a register cell 320 of FIG. 3A. Multiple feedback signals may be received, at a number of input feedback nodes (e.g., $Q_{b+1}$, $Q_{b+2}$, $Q_{b+3}$, and $Q_{B+4}$ of FIG. 3A) of the register cell 320 (operation block 620). At operation block 630, a startup signal may be received at a startup node 306 of FIG. 3A of the register cell 320. In response to receiving the startup signal, an output clock (e.g., first pulse of $LO_0$ of output clocks 350) may be generated at an output node (e.g., Q of FIG. 3A), at a predefined portion (e.g., a rising edge) of at least one of the received input clock signals 410 (operation block 630). At operation block 640, a stable high frequency output clock (e.g., one of the clocks 350 of FIG. 3B) may be provided, at an output node Q of the register cell 320, by utilizing the feedback signals received by the plurality of input feedback nodes (e.g., $Q_{b+1}$, $Q_{b+2}$, $Q_{b+3}$, and $Q_{B+4}$). The uncorrelated noise on the output clocks of the circuit may be reduced by coupling the clock input node 308 of the register cell 320 directly to an output stage 322 of FIG. 3A of the register cell 320 that provides the output clock.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A circuit for high frequency, non-overlapping clocks generation, the circuit comprising:
   a clock input node disposed to receive input clock signals;
   a plurality of input feedback nodes disposed to receive a plurality of feedback signals;
   a startup node disposed to receive a startup signal and, in response to receiving the startup signal, generate an output clock at a predefined portion of at least one of the received input clock signals; and
   an output stage configured to provide the output clock, wherein,
   the plurality of feedback signals received by the plurality of input feedback nodes are utilized to provide a stable high frequency output clock.

2. The circuit of claim 1, wherein:
   a) the circuit is configured as a register cell of an M-register clock generator circuit,
   b) the M-register clock generator circuit comprises M register cells, M being a nonzero even integer, and
   c) the M-register clock generator circuit is configured to generate M non-overlapping clocks.

3. The circuit of claim 2, wherein a count N of the plurality of input feedback nodes is equal to M divided by four, and the N feedback signals provide for the M-register clock generator circuit to generate a unique non-zero stable output condition.

4. The circuit of claim 2, wherein input clock signals of the M-register clock generator circuit are differential signals and each have an oscillation frequency that is M/2 times an intended frequency of the generated non-overlapping clock.

5. The circuit of claim 2, wherein a count N of the plurality of input feedback nodes is equal to M divided by two, and the N feedback signals provide for the M-register clock generator circuit to generate a unique non-zero stable output condition.

6. The circuit of claim 2, further comprising a D-input node disposed to receive input data and provide the input data at an output node at the predefined portion of the received input clock signal, and wherein the predefined portion of the received input clock signal comprises an edge of the received input clock signal.

7. The circuit of claim 2, wherein at least some of the plurality of input feedback nodes of each register cell is coupled to an output feedback node of a successive register cell of the M-register divider.

8. The circuit of claim 2, wherein each of the generated M non-overlapping clocks has a duty cycle of 100/M percent.

9. The circuit of claim 2, wherein the startup signal is applied to the startup node of the first register cell, and wherein the M-register clock generator circuit is configured to function properly independent of the sharpness of the startup signal.

10. The circuit of claim 2, wherein the M-register clock generator circuit is configured to reject an external interference and proper functioning of the M-register clock generator circuit is not disrupted by the external interference.

11. The circuit of claim 1, wherein the clock output node is directly coupled to the output stage to reduce noise, and wherein the noise of the register cell includes at least one of flicker noise or thermal noise, and is substantially contributed by one or more transistors of the output stage.

12. The circuit of claim 2, wherein:
   a) inputs of the output stage comprises the clock input node and an output feedback node,
   b) the register cell further comprises a D-input node disposed to receive input data and provide the input data at an output node at the predefined portion of the received input clock signal,
   c) the output feedback node in pulled up by at least one of the plurality of feedback signals, and
   d) the output feedback node is pulled down by at least one of the startup signals or a signal at the D-input node.

13. A method for generation of high frequency, non-overlapping clocks, the method comprising:
   receiving input clock signals at a clock input node of a circuit;
   receiving a plurality of feedback signals at a plurality of input feedback nodes of the circuit;
   receiving a startup signal at a startup node of the circuit and, in response to receiving the startup signal, generating an output clock at a predefined portion of at least one of the received input clock signals; and providing, at an output node of the circuit, a stable high frequency output clock by utilizing the feedback signals received by the plurality of input feedback nodes.

14. The method of claim 13, further comprising:
   a) configuring an M-register clock generator circuit by consecutively coupling M replicas of the circuit, wherein the M-register clock generator circuit comprises M register cells, M being a nonzero even integer, and
   b) configuring the M-register clock generator circuit to generate M non-overlapping clocks.

15. The method of claim 13, wherein a count N of the plurality of input feedback nodes is equal to M divided by four, and the N feedback signals provide for the M-register clock generator circuit to generate a unique non-zero stable output condition.

16. The method of claim 13, wherein input clock signals of the M-register clock generator circuit are differential signals and each have an oscillation frequency that is M/2 times an intended frequency of the generated non-overlapping clock.

17. The method of claim 13, wherein a count N of the plurality of input feedback nodes is equal to M divided by two, and the N feedback signals provide for the M-register clock generator circuit to generate a unique non-zero stable output condition.

18. The method of claim 13, further comprising:
   coupling at least some of the plurality of input feedback nodes of each register cell to an output feedback node of a successive register cell of the M-register divider;
   applying the startup signal to the startup node of the first register cell;
   configuring the M-register clock generator circuit to properly function, independent of the sharpness of the startup signal; and
   configuring the M-register clock generator circuit to reject an external interference so that proper functioning of the M-register clock generator circuit is not disrupted by the external interference.

19. The method of claim 13, wherein:
   a) each of the generated M non-overlapping clocks has a duty cycle of 100/M percent,
   b) the noise in the circuit is reduced by coupling the clock input node of the circuit directly to an output stage of the circuit that provides the output clock,
   c) the noise of the register cell includes at least one of flicker noise or thermal noise, and is substantially contributed by one or more transistors of the output stage.

20. A passive mixer circuit comprising:
   a radio frequency (RF) input node disposed to receive an RF signal;
   a multiphase local oscillator (LO) configured to generate a plurality of non-overlapping clock signal; and
   a plurality of multipliers, each of the plurality of multipliers configured to multiply the RF signal with one of the plurality of non-overlapping clock signals, wherein:
      a) the plurality of non-overlapping clock signals comprise M non-overlapping clock signals generated by register cells of an M-register clock generator circuit,
      b) each register cell of the M-register clock generator circuit is configured to generate a clock of the plurality of non-overlapping clocks, and comprises:
         a clock input node disposed to receive an input clock signal;
         a plurality of input feedback nodes disposed to receive a plurality of feedback signals;
         a startup node disposed to receive a startup signal and, in response to receiving the startup signal, generate a clock signal of at a predefined portion of the received input clock signal; and
         an output stage configured to provide a clock signal of the plurality of non-overlapping clock signals, wherein,
         the feedback signals received by the plurality of input feedback nodes are utilized to provide a stable high frequency clock signal.

21. The passive mixer circuit of claim 19, wherein:
   a) a count N of the plurality of input feedback nodes is equal to M divided by four,
   b) the N feedback signals provide for the M-register clock generator circuit to generate a unique non-zero stable output condition,
   c) input clock signals of the M-register clock generator circuit are differential signals and each have an oscillation frequency that is M/2 times an intended frequency of the generated non-overlapping clock,
   d) a count N of the plurality of input feedback nodes is equal to M divided by two,
   e) at least some of the plurality of input feedback nodes of each register cell is coupled to an output feedback node of a successive register cell of the M-register divider, and
   f) the clock input node in directly coupled to the output stage to reduce at least one of flicker noise or thermal noise.

* * * * *